(12) United States Patent
Jones et al.

(10) Patent No.: US 7,514,340 B2
(45) Date of Patent: *Apr. 7, 2009

(54) COMPOSITE INTEGRATED DEVICE AND METHODS FOR FORMING THEREOF

(75) Inventors: Robert E. Jones, Austin, TX (US); Ajay Somani, Cambridge, MA (US)

(73) Assignee: Freescale Semiconductor, Inc., Austin, TX (US)

( * ) Notice: Subject to any disclaimer, the term of this patent is extended or adjusted under 35 U.S.C. 154(b) by 325 days.

This patent is subject to a terminal disclaimer.

(21) Appl. No.: 11/368,720

(22) Filed: Mar. 6, 2006

(65) Prior Publication Data

US 2007/0170585 A1    Jul. 26, 2007

(51) Int. Cl.
  *H01L 21/30* (2006.01)
(52) U.S. Cl. .................. 438/455; 438/108; 438/118; 438/119; 438/666; 257/686; 257/734; 257/753
(58) Field of Classification Search ............. 438/108, 438/118, 119, 455, 666; 257/686, 734, 753; 156/60
See application file for complete search history.

(56) References Cited

U.S. PATENT DOCUMENTS

| | | | |
|---|---|---|---|
| 4,818,728 A * | 4/1989 | Rai et al. .............. 438/108 |
| 5,817,572 A | 10/1998 | Chiang et al. | |
| 6,080,640 A * | 6/2000 | Gardner et al. .............. 438/455 |
| 6,232,219 B1 | 5/2001 | Blalock et al. | |
| 6,887,769 B2 * | 5/2005 | Kellar et al. .............. 438/455 |
| 6,962,835 B2 * | 11/2005 | Tong et al. .............. 438/108 |
| 2002/0160596 A1 | 10/2002 | Weinrich et al. | |
| 2005/0161795 A1 | 7/2005 | Tong et al. | |
| 2006/0003547 A1* | 1/2006 | Kobrinsky et al. .......... 438/455 |
| 2006/0292824 A1* | 12/2006 | Beyne et al. .............. 438/455 |

* cited by examiner

*Primary Examiner*—Ha Tran T Nguyen
*Assistant Examiner*—Daniel Whalen
(74) *Attorney, Agent, or Firm*—Ingrassia, Fisher & Lorenz, P.C.

(57) ABSTRACT

A method for making a composite integrated device includes providing a first integrated device having a substrate, an overlying interconnect region, and a contact, wherein the contact electrically contacts the interconnect region and is at a surface of the first integrated device. The method further includes forming a sidewall spacer along a sidewall of a first opening in a first dielectric layer, located over the surface of the integrated device, and providing a deformable metal feature adjacent to the sidewall spacer and in the first opening. The method further includes providing a second integrated device having a substrate, an overlying interconnect region, a contact, and a second dielectric layer surrounding the contact of the second integrated device. The method further includes contacting the contact of the second integrated device with the deformable metal feature and pressing the first dielectric layer against the second dielectric layer.

17 Claims, 5 Drawing Sheets

US 7,514,340 B2

COMPOSITE INTEGRATED DEVICE AND METHODS FOR FORMING THEREOF

CROSS REFERENCE TO A RELATED APPLICATION

A related, copending application is entitled "Semiconductor Interconnect Having Adjacent Reservoir for Bonding and Method for Formation," by Ritwik Chatterjee, application Ser. No. 11/339,132, assigned to Freescale Semiconductor, Inc., and was filed on Jan. 25, 2006.

BACKGROUND OF THE INVENTION

1. Field of the Invention

This invention relates in general to semiconductor devices and more specifically to a composite integrated device and methods for forming thereof.

2. Description of the Related Art

Composite integrated devices formed using face-to-face bonding, where metal-to-metal interconnect and dielectric-to-dielectric bonds are formed in the same process flow, suffer from several problems. For example, a lack of co-planarity of the metal and dielectric surfaces may result in unreliable formation of the metal-to-metal interconnects and dielectric-to-dielectric bonds. Prior attempts to solve this problem have resulted in processes with manufacturing problems, such as creating high degree of stresses on underlying dielectrics and/or requiring the formation of a conductive bridge between two unconnected metal regions.

Thus, there is a need for improved composite integrated devices and methods for forming thereof.

BRIEF DESCRIPTION OF THE DRAWINGS

The present invention may be better understood, and its numerous objects, features, and advantages made apparent to those skilled in the art by referencing the accompanying drawings.

Figure 1:
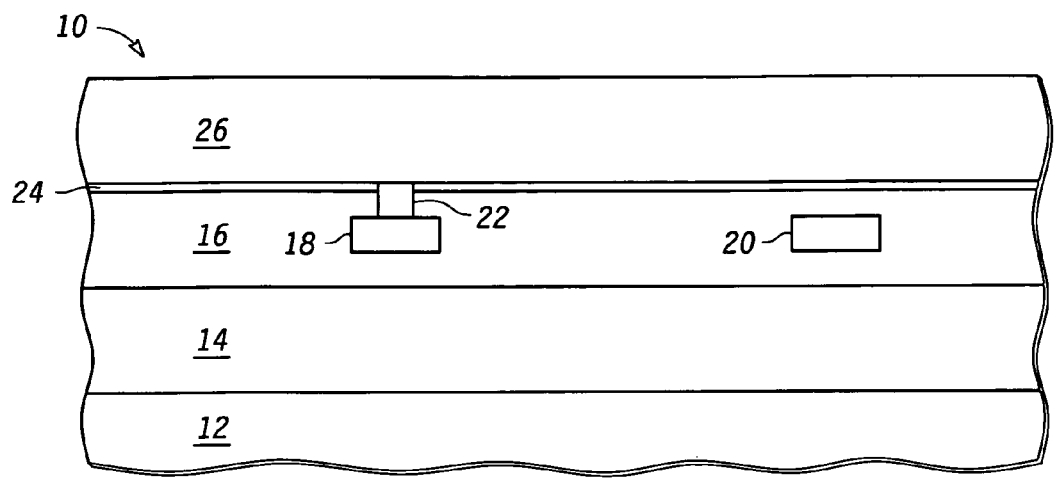
FIG. 1 is a partial side view of one embodiment of an integrated device during a processing stage, consistent with one embodiment of the invention.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

The following sets forth a detailed description of a mode for carrying out the invention. The description is intended to be illustrative of the invention and should not be taken to be limiting. Exemplary composite integrated devices formed using exemplary processes described herein may be used in 3D integration, such as memory on logic. Consistent with the embodiments of the invention such 3D integration is not limited to any particular device feature size or technology. Additionally, composite integrated devices may be formed by combining integrated devices formed on two separate wafers or by combining a die with an integrated device formed on another wafer.

In one aspect, a method for making a composite integrated device includes providing a first integrated device having a substrate, an overlying interconnect region, and a contact, wherein the contact electrically contacts the interconnect region and is at a surface of the first integrated device. The method further includes forming a first dielectric layer over the surface of the first integrated device and forming a first opening in the first dielectric layer to expose the contact of the first integrated device. The method further includes forming a sidewall spacer along a sidewall of the first opening and providing a deformable metal feature adjacent to the sidewall spacer and in the first opening, so that the deformable metal feature electrically contacts the contact of the first integrated device and extends above the dielectric layer. The method further includes removing the sidewall spacer and providing a second integrated device having a substrate, an overlying interconnect region, a contact, and a second dielectric layer surrounding the contact of the second integrated device, wherein the contact of the second integrated device electrically contacts the interconnect region of the second integrated device and is at a surface of the second integrated device. The method further includes contacting the contact of the second integrated device with the deformable metal feature. The method further includes pressing the first dielectric layer against the second dielectric layer to bring about bonding the contact of the second integrated circuit to the deformable feature and bonding the second dielectric layer to the first dielectric layer.

In another aspect, a method of making a composite integrated device includes providing a first integrated device having a substrate, an overlying interconnect region, and a contact, wherein the contact electrically contacts the interconnect region and is at a surface of the first integrated circuit. The method further includes forming a first dielectric layer over the surface of the first integrated device and forming a first opening in the first dielectric layer to expose the contact of the first integrated device. The method further includes forming a sidewall spacer along a sidewall of the first opening and providing a first metal feature that is adjacent to the sidewall spacer and in the first opening and has a height that is below a height of the first dielectric layer. The method further includes removing the sidewall spacer and forming a deformable metal feature that is over the first metal feature and that extends above the height of the first dielectric feature. The method further includes providing a second integrated device having a substrate, an overlying interconnect region, a contact, and a second dielectric layer surrounding the contact of the second integrated device, wherein the contact of the second integrated device is electrically coupled to the interconnect region and is at a surface of the second integrated device. The method further includes contacting the contact of the second integrated device with the deformable metal feature and deforming the deformable metal feature so that the first dielectric layer contacts the second dielectric layer. The method further includes bonding the second dielectric layer to the first dielectric layer.

In yet another aspect, a composite integrated device includes a first integrated device having a substrate, an overlying interconnect region, and a contact, wherein the contact electrically contacts the interconnect region and is at a surface of the first integrated circuit. The composite integrated device further includes a first dielectric layer over the surface of the first integrated device having a first opening over the contact of the first integrated circuit device, wherein the opening has a sidewall that is substantially vertical. The composite integrated device further includes a first metal feature that is spaced from the sidewall and in the first opening and a deformable metal feature that is over and on sides of the first metal feature, spaced from the sidewall, and in the first opening, wherein the deformable metal feature is electrically coupled to the contact of the first integrated device and is even with a height of the first dielectric layer. The composite integrated device further includes a second integrated device having a substrate, an overlying interconnect region, a contact, and a second dielectric layer surrounding the contact of the second integrated device, wherein the contact of the second integrated device is electrically coupled to the interconnect region of the second integrated circuit, is at a surface of the second integrated device, and contacts the deformable metal feature.

FIG. 1 is a partial side view of one embodiment of an integrated device during a processing stage, consistent with one embodiment of the invention. An integrated device 10 may include a substrate 12, an active circuitry layer 14, and an interconnect layer 16. Active circuitry layer 14 may include logic and/or memory circuits corresponding to the functionality associated with integrated device 10. Interconnect layer 16 may include interconnect lines 18 and 20, for example. Interconnect line 18 may be connected to a via 22, which is useful as a contact. Interconnect line 18 may be formed using copper, aluminum, or gold. Via 22 may be formed using any suitable conductive material, such as copper, tungsten, or aluminum. As part of the processing of integrated device 10 a dielectric etch stop layer 24 may be formed. Next, as shown in FIG. 1, a dielectric layer 26 may be formed on top of dielectric etch stop layer 24. Although FIG. 1 shows only two interconnect lines 18 and 20, interconnect layer 16 may include additional interconnect lines. Further, integrated device 10 shown at this stage of processing may include additional layers.

Figure 2:
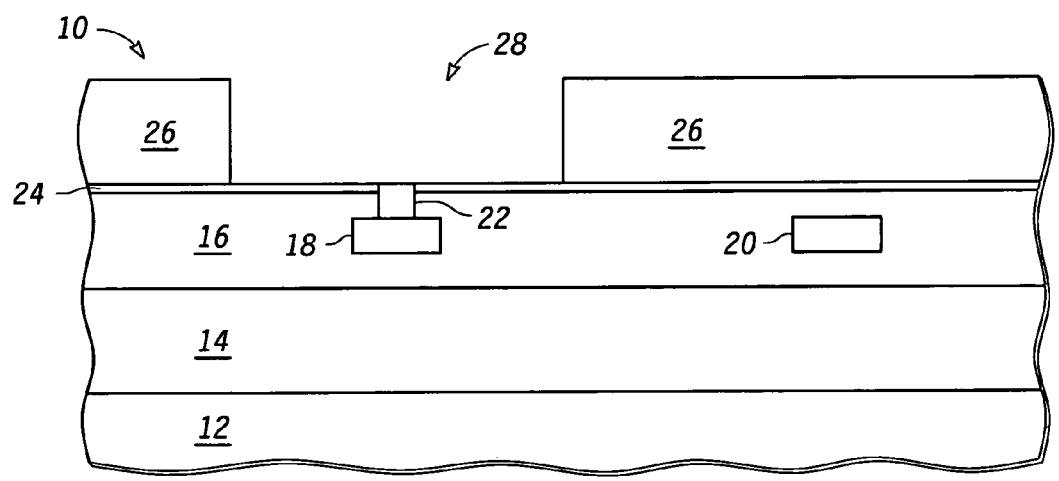
FIG. 2 is a partial side view of one embodiment of an integrated device during a processing stage, consistent with one embodiment of the invention.
Figure 3:
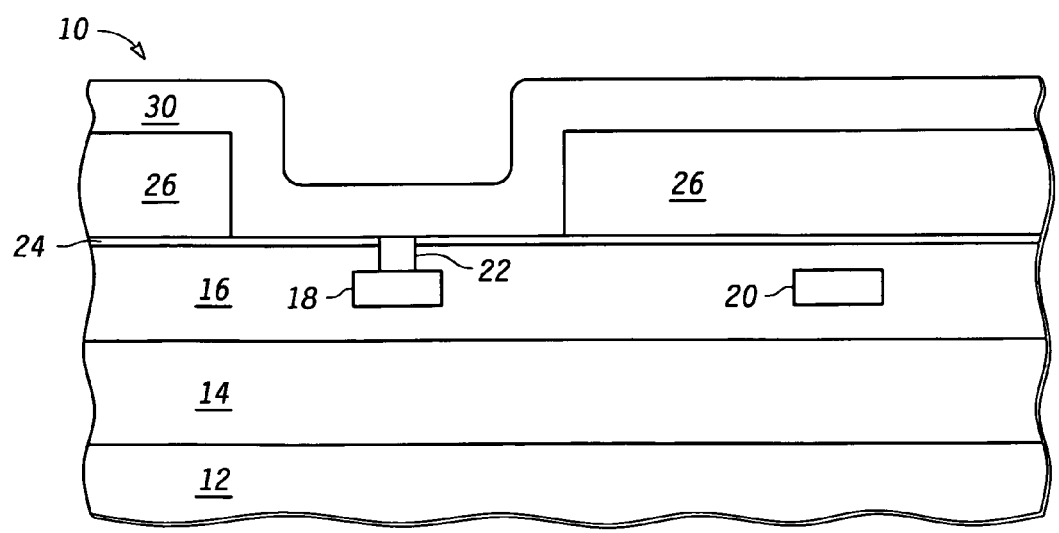
FIG. 3 is a partial side view of one embodiment of an integrated device during a processing stage, consistent with one embodiment of the invention.
Figure 4:
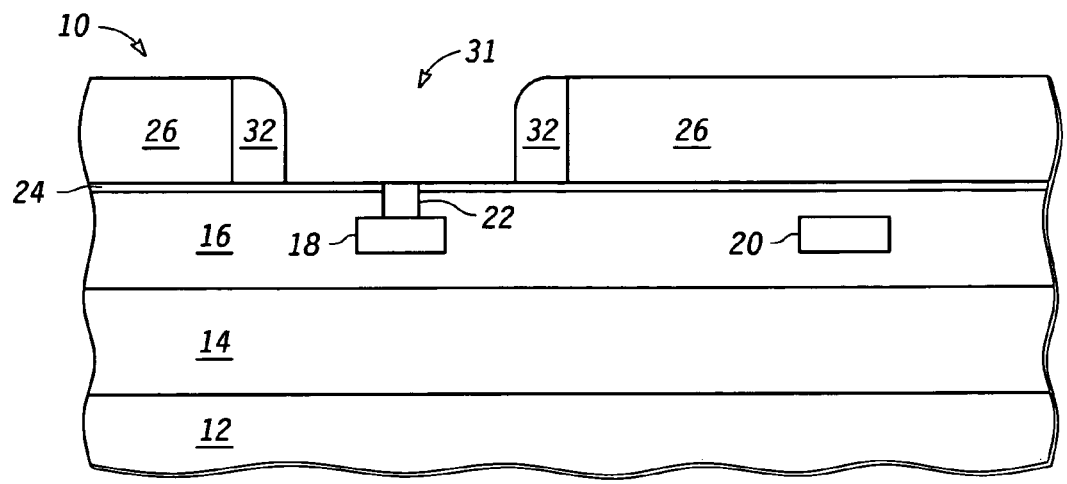
FIG. 4 is a partial side view of one embodiment of an integrated device during a processing stage, consistent with one embodiment of the invention.

As shown in FIG. 2, an opening 28 above via 22 may be formed into dielectric layer 26. Opening 28 may be formed by etching, for example. As part of the etching process, dielectric etch stop layer 24 may be used as an etch stop layer. Although FIG. 2 shows only one opening, additional openings for other vias (not shown) may also be formed as part of this step. Referring now to FIG. 3, a conformal layer 30 may be formed on a surface of composite integrated device 10. By way of example, conformal layer 30 may be a dielectric layer. Next, as shown in FIG. 4, an opening 31 around via 22 may be formed in conformal layer 30. Further, a sidewall spacer 32 may be formed along the sidewall of opening 31 by anisotropic etching of conformal layer 30.

Figure 5:
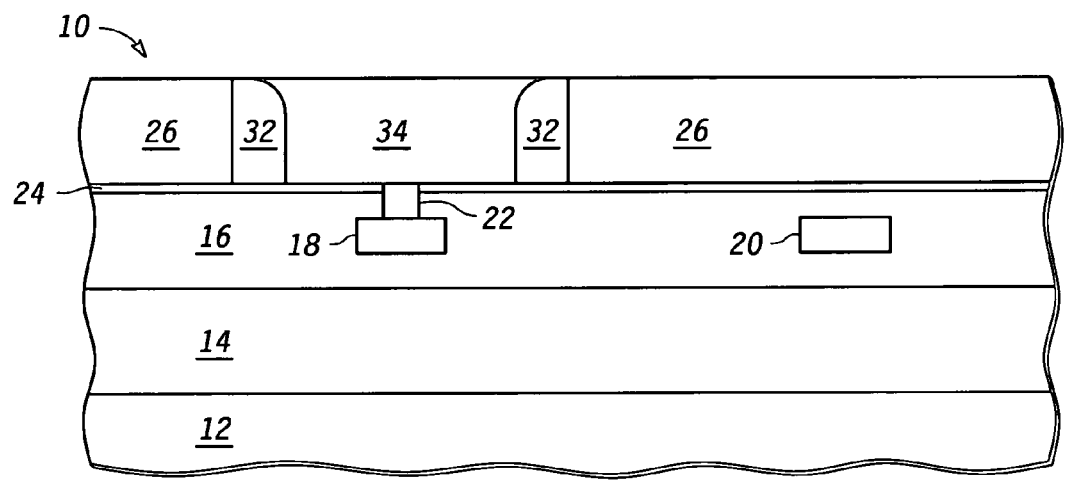
FIG. 5 is a partial side view of one embodiment of an integrated device during a processing stage, consistent with one embodiment of the invention.
Figure 6:
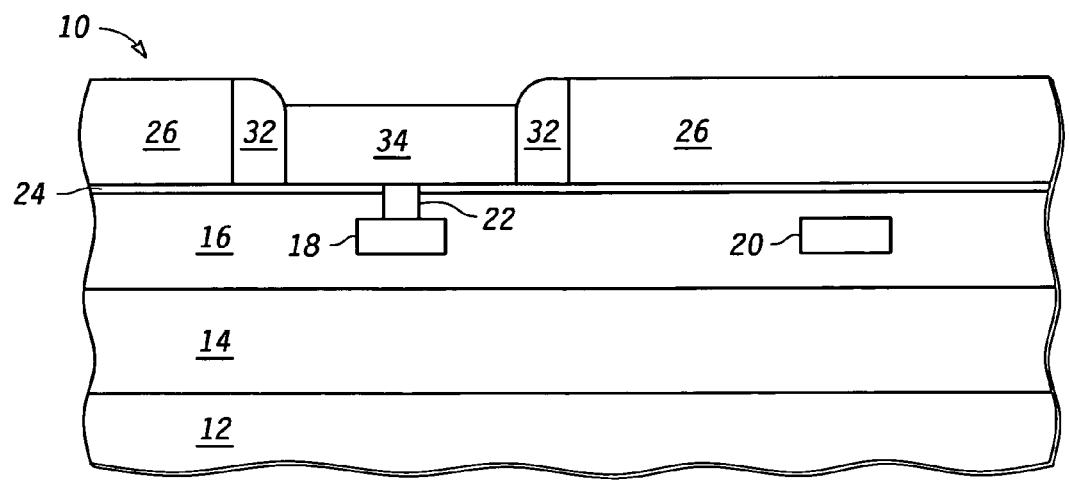
FIG. 6 is a partial side view of one embodiment of an integrated device during a processing stage, consistent with one embodiment of the invention.
Figure 7:
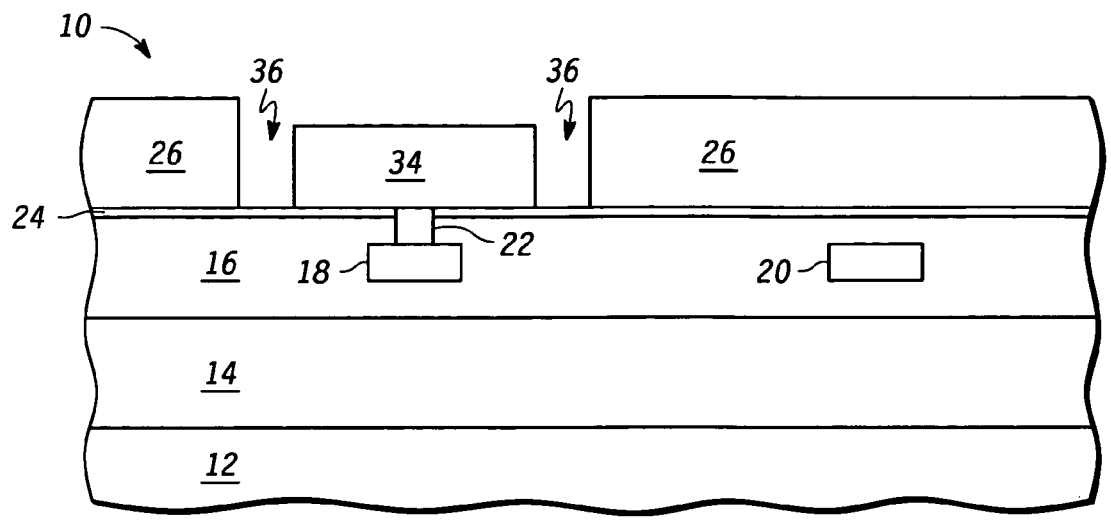
FIG. 7 is a partial side view of one embodiment of an integrated device during a processing stage, consistent with one embodiment of the invention.
Figure 8:
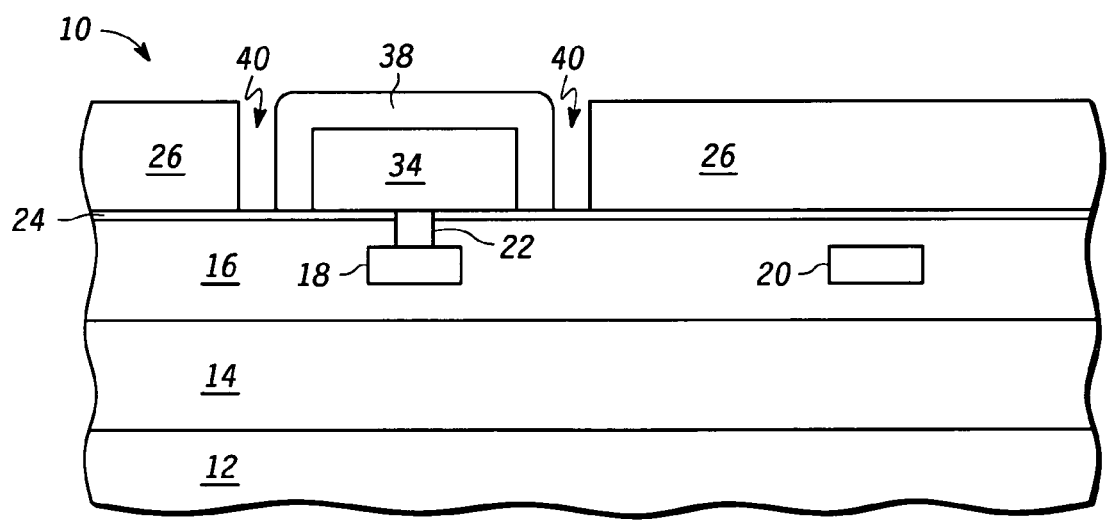
FIG. 8 is a partial side view of one embodiment of an integrated device during a processing stage, consistent with one embodiment of the invention.

Next, as shown in FIG. 5, a deformable metal feature 34 may be formed in opening 31. Although deformable metal feature 34 is shown level with dielectric layer 26, deformable metal feature 34 may extend above or below dielectric layer 26. Further, as shown in FIG. 6, by way of example, using a wet etch process deformable metal feature 34 may be thinned. Next, as shown in FIG. 7, sidewall spacer 32 may be removed using a selective etch, for example, and thereby creating open area 36. Next, as shown in FIG. 8, another deformable metal feature 38 may be formed on top of deformable metal feature 34. As used herein, the term "deformable metal feature" refers to a single metal feature or a combination metal feature. Thus, for example, any metal, alloy, or any combination thereof, which is malleable or has a low melting point may be used as the deformable feature. Formation of deformable metal feature leaves part of open area 36 as expansion region 40. Expansion region 40 provides space into which metal corresponding to deformable metal feature may expand.

Figure 9:
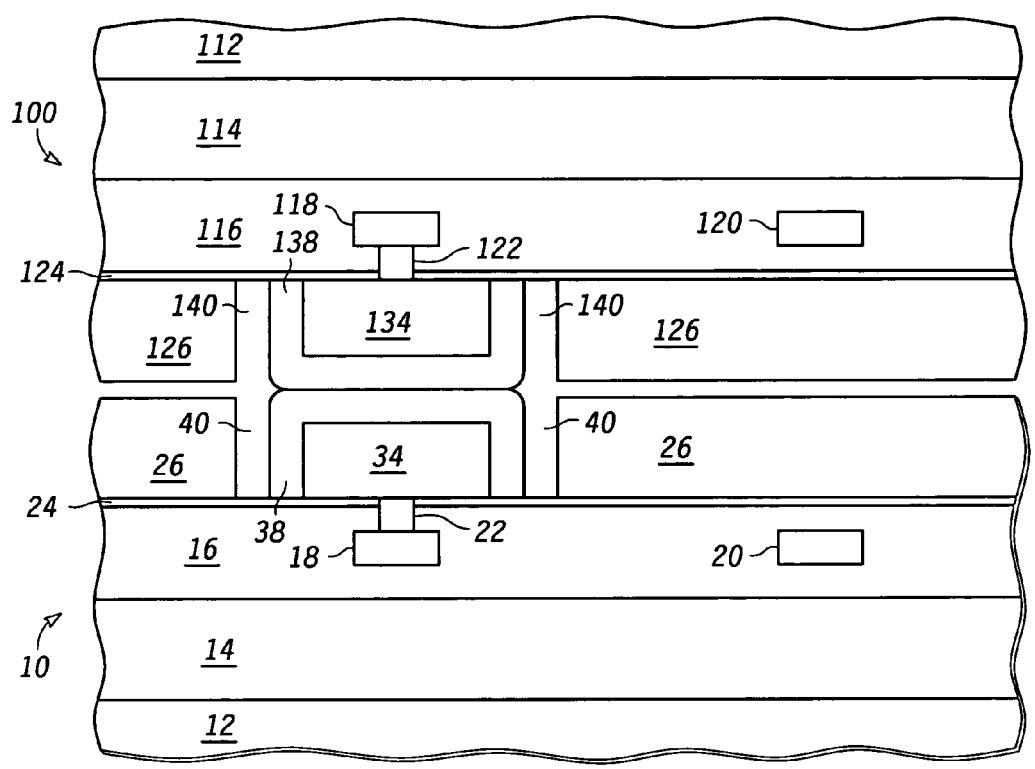
FIG. 9 is a partial side view of one embodiment of a composite integrated device during a processing stage, consistent with one embodiment of the invention.

Next, as shown in FIG. 9, a second integrated device 100 may be brought into contact with integrated device 10. In particular, as shown in FIG. 9, at this stage of the processing, only deformable metal features (38 and 138, respectively) of the two integrated devices may be contacting each other. Second integrated device 100 may include similar layers and features as integrated device 10. Thus, layers and features of second integrated device 100 are referred to using reference numerals 112 to 140 corresponding to reference numerals 12 to 40, respectively. Although FIG. 9 shows integrated device 10 and second integrated device 100 as having similar layers and features, they may be very different from each other or identical.

Figure 10:
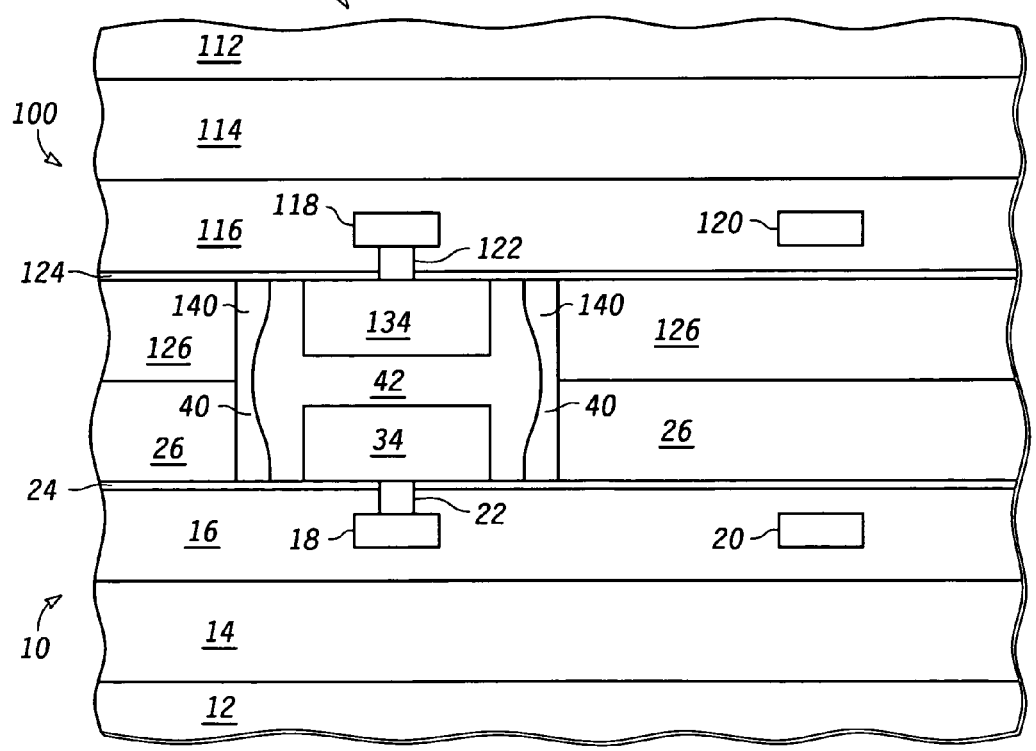
FIG. 10 is a partial side view of one embodiment of a composite integrated device during a processing stage, consistent with one embodiment of the invention.

Further, as shown in FIG. 10, subjecting integrated devices 10 and 100 to pressure, temperature, or a combination thereof results in bonding of deformable metal features 38 (or a combination of 34 and 38) and 138 (or a combination of 134 and 138) to form a mechanical bond and electrical contact through bonded metal region 42. This may include pressing the first dielectric layer 26 of the first integrated device 10 against the second dielectric layer 126 of the second integrated device 100 to bond a second contact 122 of the second integrated device 100 to the deformable feature 34, 38 and to bond the second dielectric layer 126 to the first dielectric layer 26. Pressing may be characterized as bonding the second contact 122 and bonding the second dielectric layer 126 contemporaneously. Expansion regions 40 and 140 permit the deformable metal features to expand laterally. This in turn permits vertical movement of the two integrated devices, such that dielectric layers (26 and 126) also contact and form a mechanical bond. The composite integrated device 200 is formed by the bonding of integrated devices 10 and 100. By way of example, deformable metal features 34, 38, 134, and 138 may be formed using a malleable metal alloy (e.g., solder). In an embodiment, metal features 38, 138 may be more malleable than metal features 34, 134. Alternately, deformable metal feature 34 and 134 may be formed using a first type of metal (e.g., copper) and deformable metal feature 38 and 138 may be formed using a second type of metal (e.g., tin) having a low melting point, such that the second type of metal melts and forms an alloy with the first type of metal. In an embodiment, the melting temperature of deformable metal features 38, 138 may be lower than the melting temperature of deformable metal features 34, 134. Heat above the melting temperature of deformable metal features 38,138 may be applied during pressing to melt the second type of metal, in an embodiment. Alternately and/or additionally, deformable metal features may be subjected to further annealing to form an inter-metallic compound with high melting temperature through solid solution diffusion. For example, subjecting copper and tin to annealing may result in the formation of Cu.sub.3Sn inter-metallic compound. Other types of metals, such as copper and indium, indium and gold, and tin and gold may also be used as part of the formation of the deformable metal feature. Additional types of metals, for example, lead and tin, may also be used consistent with some embodiments of the invention. Additionally, a thin coating of metallic layer could be added on top of deformable metal feature to prevent oxidation of the deformable metal feature.

Figure 11:
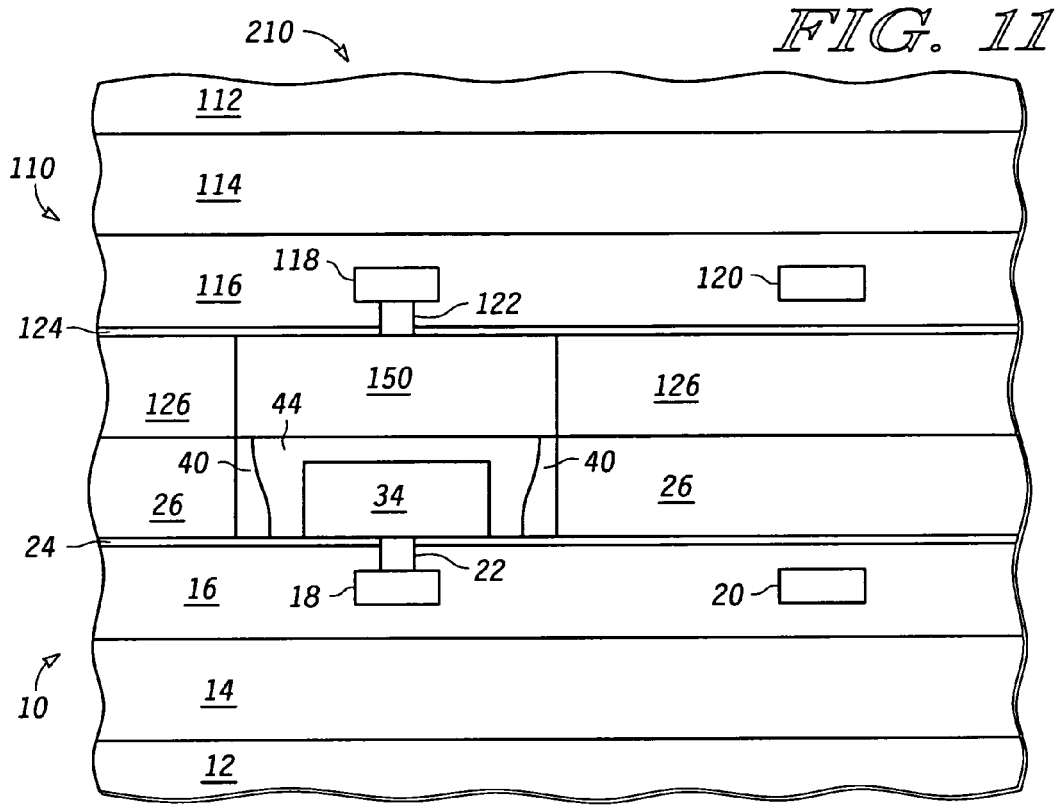
FIG. 11 is a partial side view of one embodiment of a composite integrated device during a processing stage, consistent with one embodiment of the invention.

FIG. 11 shows a second embodiment of a composite integrated device 210. Composite integrated device 210 may be formed by bringing a second integrated device 110 into contact with integrated device 10. Second integrated device 110 may include similar layers and features as integrated device 10, except it may not have any deformable metal features (for example 34 and 38, respectively). Instead, second integrated device 110 may include a metal contact region 150. As described above with respect to FIGS. 9 and 10, subjecting integrated devices 10 and 110 to pressure, temperature, or a combination thereof results in bonding of deformable metal feature 38 (or a combination of 34 and 38) to metal contact region 150 to form a mechanical bond and electrical contact through bonded metal region 44. Expansion region 40 permits the deformable metal feature to expand laterally. This in turn permits vertical movement of the two integrated devices, such that dielectric layers (26 and 126) also contact and form a mechanical bond. Any suitable conductive material, for example, copper or gold may be used to form metal contact region 150. Suitable combinations of deformable metal feature, as described above with respect to FIGS. 9 and 10, may be used.

Figure 12:
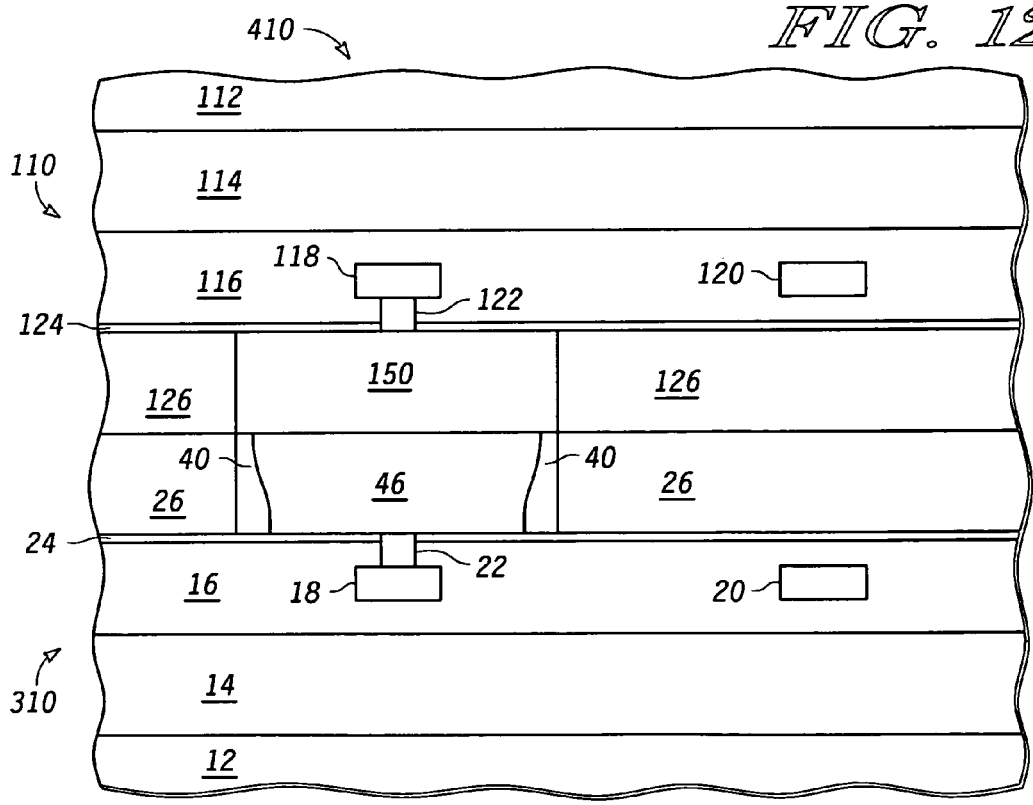
FIG. 12 is a partial side view of one embodiment of a composite integrated device during a processing stage, consistent with one embodiment of the invention.

FIG. 12 shows a third embodiment of a composite integrated device 410. Composite integrated device 410 may be formed by bringing a second integrated device 110 into contact with integrated device 310. Integrated device 310 may include similar features and layers as integrated device 10, except deformable feature may be only one metal type, e.g., lead, tin, indium, bismuth, antimony, gold, copper, or any suitable combination thereof. As described above with respect to FIGS. 9 and 10, subjecting integrated devices 310 and 110 to pressure, temperature, or a combination thereof results in bonding of deformable metal feature to metal contact region 150 to form a mechanical bond and electrical contact through bonded metal region 46. Expansion region 40 permits the deformable metal feature to expand laterally. This in turn permits vertical movement of the two integrated devices, such that dielectric layers (26 and 126) also contact and form a mechanical bond. Any suitable conductive material, for example, copper or gold may be used to form metal contact region 150.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for making a composite integrated device, comprising:
    providing a first integrated device having a substrate, an overlying interconnect region, and a contact, wherein the contact electrically contacts the interconnect region;
    forming a first dielectric layer over a surface of the first integrated device;
    forming a first opening in the first dielectric layer to expose the contact of the first integrated device;
    forming a sidewall spacer along a sidewall of the first opening;
    providing a deformable metal feature adjacent to the sidewall spacer and in the first opening, so that the deformable metal feature electrically contacts the contact of the first integrated device and extends above the first dielectric layer;
    removing the sidewall spacer;
    providing a second integrated device having a second substrate, a second overlying interconnect region, a second contact, and a second dielectric layer surrounding the second contact of the second integrated device, wherein the second contact of the second integrated device electrically contacts the second interconnect region of the second integrated device;
    contacting the second contact of the second integrated device with the deformable metal feature; and
    pressing the first dielectric layer against the second dielectric layer to bring about bonding the second contact of the second integrated circuit to the deformable feature and bonding the second dielectric layer to the first dielectric layer.

2. The method of claim 1, wherein the step of providing a deformable metal feature further comprises etching back the first dielectric layer to form an opening within the first dielectric layer within which the deformable metal feature is provided.

3. The method of claim 1, wherein the step of providing a deformable metal feature further comprises:
    forming a first metal feature in the opening; and
    forming a second metal feature that is over the first metal feature and has a height above the first dielectric layer, wherein the second metal feature is more malleable than the first metal feature.

4. The method of claim 3, wherein the first metal feature comprises copper and the second metal feature comprises a material selected from a group consisting of indium, tin, gold, silver, bismuth, antimony, and lead.

5. The method of claim 1, wherein:
    the step of removing the sidewall spacer results in an expansion region between the deformable metal feature and the sidewall of the first dielectric layer; and
    the step of pressing results in a portion of the deformable metal feature moving into the expansion region.

6. The method of claim 1, wherein the step of providing the first integrated device further comprises providing an etch stop layer on the surface of the first integrated device.

7. The method of claim 1, wherein the step of pressing is further characterized as bonding the second contact and bonding the second dielectric layer contemporaneously.

8. The method of claim 1, wherein the step of providing the second integrated device comprises providing the second contact of the second integrated device as a combination of:
   a copper contact to the second interconnect layer; and
   a contact feature that is deformable and that contacts the deformable feature of the first integrated device and the copper contact.

9. A method for making a composite integrated device, comprising:
   providing a first integrated device having a substrate, an overlying interconnect region, and a contact, wherein the contact electrically contacts the interconnect region;
   forming a first dielectric layer over a surface of the first integrated device;
   forming a first opening in the first dielectric layer to expose the contact of the first integrated device;
   forming a sidewall spacer along a sidewall of the first opening;
   forming a first metal feature having a first melting temperature in the first opening adjacent to the sidewall spacer, so that the first metal feature electrically contacts the contact of the first integrated device;
   removing the sidewall spacer;
   forming a second metal feature having a second melting temperature lower than the first melting temperature over the first metal feature and having a height above the first dielectric layer;
   providing a second integrated device having a second substrate, a second overlying interconnect region, a second contact, and a second dielectric layer surrounding the second contact of the second integrated device, wherein the second contact of the second integrated device electrically contacts the second interconnect region of the second integrated device;
   contacting the second contact of the second integrated device with the second metal feature; and
   pressing the first dielectric layer against the second dielectric layer to bring about bonding the second contact of the second integrated circuit to the second metal feature and bonding the second dielectric layer to the first dielectric layer.

10. The method of claim 9, wherein the step of pressing comprises applying heat above the second melting temperature.

11. The method of claim 9, wherein the first metal feature comprises a material selected from a group consisting of copper and gold and the second metal feature comprises a material selected from a group consisting of indium, tin, bismuth, and lead.

12. The method of claim 9, wherein the step of pressing causes alloying between the second metal feature and the first metal feature.

13. A method of making a composite integrated device, comprising:
   providing a first integrated device having a substrate, an overlying interconnect region, and a contact, wherein the contact electrically contacts the interconnect region;
   forming a first dielectric layer over a surface of the first integrated device;
   forming a first opening in the first dielectric layer to expose the contact of the first integrated device;
   forming a sidewall spacer along a sidewall of the first opening;
   providing a first metal feature that is adjacent to the sidewall spacer and in the first opening and has a height that is below a height of the first dielectric layer;
   removing the sidewall spacer;
   forming a deformable metal feature that is over the first metal feature and that extends above the height of the first dielectric feature;
   providing a second integrated device having a second substrate, a second overlying interconnect region, a second contact, and a second dielectric layer surrounding the second contact of the second integrated device, wherein the second contact of the second integrated device is electrically coupled to the second interconnect region;
   contacting the second contact of the second integrated device with the deformable metal feature;
   deforming the deformable metal feature so that the first dielectric layer contacts the second dielectric layer; and
   bonding the second dielectric layer to the first dielectric layer.

14. The method of claim 13, wherein the step of deforming the deformable feature causes the deformable feature to bond to the contact of the second integrated device.

15. The method of claim 13, wherein the step of bonding the second dielectric layer results when the first dielectric layer contacts the second dielectric layer.

16. The method of claim 13, wherein the step of deforming comprises:
   applying heat; and pressing the first integrated device against the second integrated device.

17. The method of 13, wherein:
   the step of removing the sidewall spacer is further characterized as resulting in an expansion region between the deformable region and the sidewall of the first dielectric layer; and
   the step of deforming is further characterized as resulting in the expansion region being at least partially filled with a portion of the deformable metal feature.

* * * * *